(12) United States Patent
Maheshwari et al.

(10) Patent No.: US 6,768,618 B1
(45) Date of Patent: Jul. 27, 2004

(54) INPUT GATE PROTECTION CIRCUIT AND METHOD

(75) Inventors: Sanjeev Kumar Maheshwari, Santa Clara, CA (US); Roger Jay Bettman, Los Altos, CA (US)

(73) Assignee: Cypress SemiConductor, Corp., San Jose, CA (US)

( * ) Notice: Subject to any disclaimer, the term of this patent is extended or adjusted under 35 U.S.C. 154(b) by 0 days.

(21) Appl. No.: 10/210,279

(22) Filed: Aug. 1, 2002

(51) Int. Cl.[7] .............................................. H02H 3/22
(52) U.S. Cl. ........................................ 361/56; 361/111
(58) Field of Search .......................... 361/56–58, 111, 361/118, 91.1–91.5, 86, 18, 119

(56) References Cited

U.S. PATENT DOCUMENTS

| | | | | |
|---|---|---|---|---|
| 4,405,964 A | * | 9/1983 | Woods et al. ................. | 361/18 |
| 5,397,941 A | * | 3/1995 | Merrill ........................... | 326/68 |
| 5,677,558 A | * | 10/1997 | McGlinchey ................. | 257/370 |
| 5,852,540 A | * | 12/1998 | Haider .......................... | 361/111 |
| 5,864,226 A | * | 1/1999 | Wang et al. .................. | 323/273 |
| 6,034,553 A | * | 3/2000 | Kwong .......................... | 326/86 |
| 6,049,445 A | * | 4/2000 | Gauthier ....................... | 361/56 |
| 6,268,759 B1 | * | 7/2001 | Graves .......................... | 327/437 |

* cited by examiner

*Primary Examiner*—Brian Sircus
*Assistant Examiner*—Danny Nguyen
(74) *Attorney, Agent, or Firm*—Law Office of Dale B. Halling, LLC

(57) ABSTRACT

An input gate protection circuit has a pass transistor having a source coupled to an input signal. A first voltage range control circuit is coupled to a gate of the pass transistor. A second voltage range is control circuit coupled to the gate of the pass transistor.

20 Claims, 2 Drawing Sheets

US 6,768,618 B1

INPUT GATE PROTECTION CIRCUIT AND METHOD

FIELD OF THE INVENTION

The present invention relates generally to the field of electronic circuits and methods and more particularly to an input gate protection circuit and method.

BACKGROUND OF THE INVENTION

In modern integrated circuits it is common for a portion of the circuit to use one voltage range and a second portion of the circuit to use a second voltage. For instance, the input signal may have a range of 3.3 volts and the core portion of the circuit may operate at a nominal voltage of 2.5 volts. This presents challenges when a signal from one portion of the circuit needs to be received by the second portion of the circuit. One prior art solution has been to use a NMOS (n-metal oxide silicon) transistor to pass the high voltage signal to a signal shaping device such as an inverter. The inverter shapes the input signal and converts it to the desired signal levels. The pass transistor limits the voltage applied to the inverter. The pass transistor is a low voltage transistor and it is a general design goal to use low voltage devices. The pass transistor's gate is connected to the power supply of the second portion of the circuit or second voltage source. When no power is applied to the second portion of the circuit, the source to gate voltage of the pass transistor is equal to the high voltage and stresses the gate oxide of the pass transistor. This results in degradation of the pass transistor over time.

Thus there exists a need for a circuit and method that does not result in gate oxide stress when no power is applied to the low voltage portion of a circuit.

SUMMARY OF THE INVENTION

An input gate protection circuit that overcomes these problems has a pass transistor having a source coupled to an input signal. A first voltage range control circuit is coupled to a gate of the pass transistor. A second voltage range control circuit is coupled to the gate of the pass transistor. When power is not applied to the second portion of the circuit and the second voltage range control circuit, the first voltage range control circuit limits the voltage applied to the gate oxide of the pass transistor. In one embodiment an input shaping device has an input coupled to a drain of the pass transistor.

In one embodiment the first voltage range control circuit has a diode coupled between the input signal and the gate of the pass transistor. In another embodiment, the first voltage range control circuit has a pair of diodes coupled between the input signal and the gate of the pass transistor. In another embodiment, the input signal has a first voltage range. The first voltage range is 0.0–3.3 volts in one embodiment. The second voltage range is 0.0–1.8 volts, in one embodiment.

In one embodiment, the second voltage range circuit has a transistor coupling the gate of the pass transistor to a second voltage source. The transistor has a gate coupled to the input signal, in one embodiment.

In another embodiment, an input gate protection circuit has a pass transistor with a source coupled to an input signal. A first control circuit is coupled to a gate of the pass transistor. A second control circuit is coupled the gate of the pass transistor. In one embodiment, the first control circuit has an input coupled to the input signal. The first control circuit includes a plurality of diodes, in one embodiment.

In another embodiment, the second control circuit has an input coupled to a second voltage source. The second control circuit includes a transistor with a source coupled to a second voltage source, in one embodiment. The transistor has a drain coupled to the gate of the pass transistor, in one embodiment. the transistor has a gate coupled to the input signal and to the second voltage source, in another embodiment. The transistor is a PMOS transistor, in one embodiment.

A method of operating an input gate protection circuit includes the steps of: a) determining if a second voltage source in on; b) when the second voltage source is not on, attenuating an input signal to form an attenuated signal; and c) applying the attenuated signal to a gate of a pass transistor. When the second voltage source is on, the second voltage source is applied to the gate of the pass transistor. In one embodiment, a peak input voltage of the input signal is greater than a voltage of the voltage source. The voltage source is applied through a controllable switch in one embodiment.

In another embodiment, a diode is coupled between the input signal and the gate of the pass transistor.

DETAILED DESCRIPTION OF THE DRAWINGS

Figure 1:
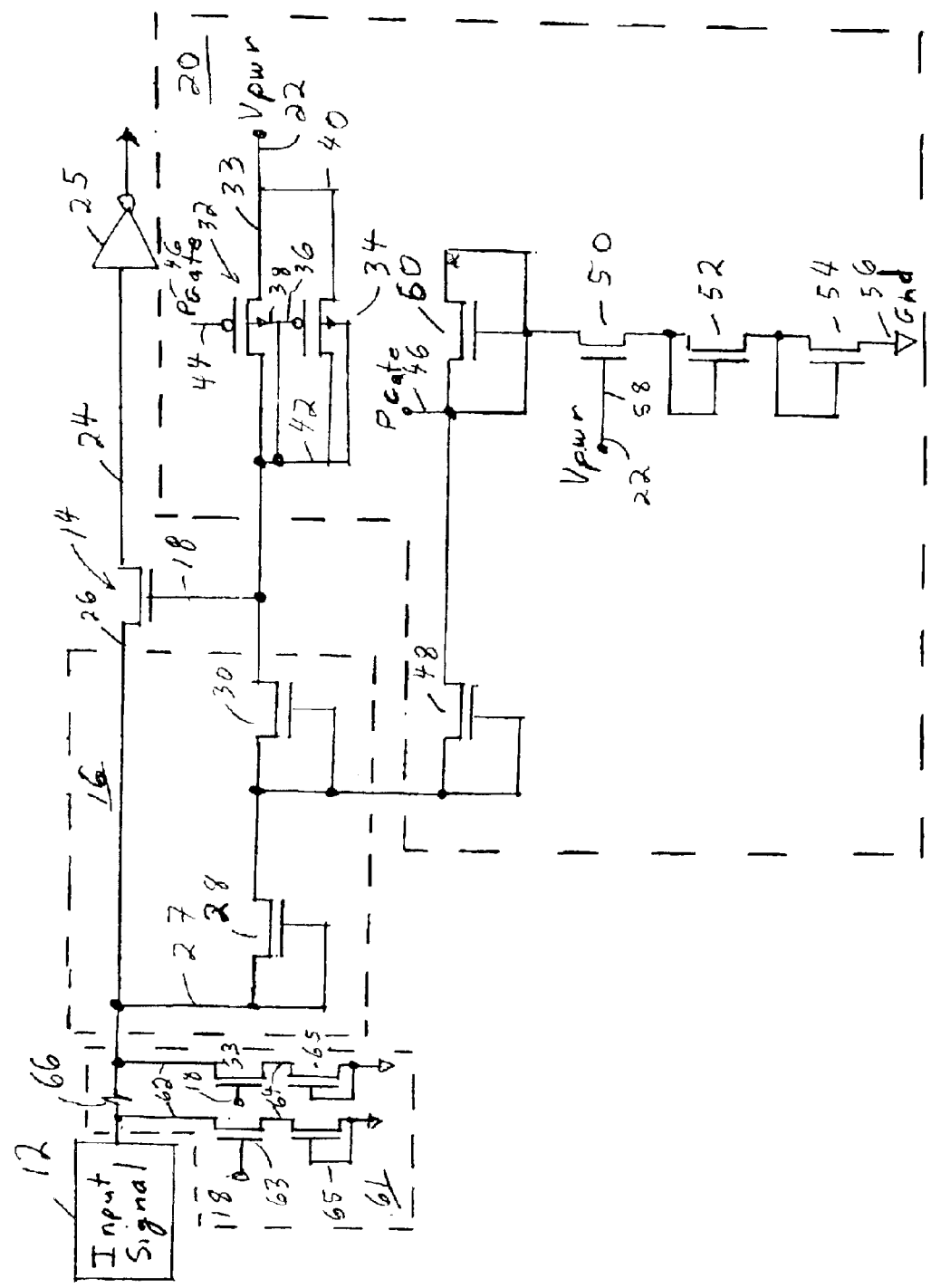
FIG. 1 illustrates a schematic diagram of an input gate protection circuit in accordance with one embodiment of the invention.

An input gate protection circuit provides a circuit that protects the gate oxide stress of the pass transistor and the input transistors from high input voltage. FIG. 1 illustrates a schematic diagram of an input gate protection circuit 10 in accordance with one embodiment of the invention. An input signal 12 is coupled to a pass transistor 14 of the circuit 10. The input signal 12 is also coupled to a first voltage range control circuit 16 (shown in dashed lines). The first voltage range control circuit 16, also called the first control circuit, is coupled to a gate 18 of the pass transistor 14. A second voltage range control circuit 20 (shown in dashed lines) is also coupled to the gate 18 of the pass transistor 14. The second voltage range control circuit 20, also called the second control circuit, receives power (Vpwr) 22 from the low voltage portion of the integrated circuit. Vpwr is also called the second voltage source. When the power (Vpwr) 22 is off the first voltage range control circuit 16 receives voltage from the input signal 12 and protects the gate oxide of the pass transistor. Note that the input signal 12 in one embodiment has a first voltage range that is greater than the voltage of the power supply (Vpwr) 22. As a result the pass transistor's gate oxide is protected even if the power supply 22 of the low voltage portion of the overall integrated circuit is off. Note that the drain 24 of the pass transistor 14 is coupled to an inverter 25 or input shaping device that shapes the input signal. The source 26 of the pass transistor 14 is coupled to the input signal 12.

The first control circuit 16 has an input 27 coupled a diode 28 and the input signal 12. A second diode 30 is coupled to the first diode 28. The pair of diodes 28, 30 are coupled to the input signal 12 and to the gate 18 of the pass transistor 14. As a result the first control circuit 16 causes the gate to source voltage of the pass transistor 14 to be no greater than two diode drops (Vtn). The exact number of diodes is not specified by the invention and different designs might require one or three diodes or a plurality of diodes. In one embodiment, the diodes 28, 30 are transistor coupled diodes.

The second control circuit 20 has an input 22 coupled to a transistor 32 and coupled to a second voltage source (Vpwr) 22. The transistor 32 is coupled to the gate 18 of the pass transistor 14. Note that transistor 32 is a PMOS (p-metal oxide silicon) transistor. A transistor 34 is essentially in parallel with the transistor 32. The transistor 34 has a gate 36 coupled to the n-well 38 of the transistor 32 and the gate 18 of pass transistor 14. The source 40 of the transistor 34 is coupled to the voltage source (Vpwr) 22. The drain 42 of the transistor 34 is coupled to the gate 36 and the gate 18 of pass transistor 14 and the n-well of the transistor 34. Transistor 34 makes sure that n-well of PMOS 32 is at highest potential available in the system. The gate 44 of the transistor 32 is control by the gate voltage (Pgate) 46. The gate voltage 46 node is coupled through a diode 48 and a diode 28 to the input signal 12. In one embodiment, the diode 48 may be replaced with a resistor, however there are area penalties for this. The gate voltage 46 is coupled through a transistor 50 and a pair of diodes 52, 54 to ground 56. Note that the transistor 60 is shorted out. The transistor 60 if not shorted can be used as an addition diode drop to ground. The transistor 50 has a gate 58 coupled to the power source (Vpwr) 22. As a result when the power source (Vpwr) 22 is on the gate voltage 46 is two diode drops (2 Vtn). Thus in the case when power is on (normal operation of the device), the PMOS transistor 32, controlled by gate voltage (Pgate) 46, will provide a path for the second voltage source (Vpwr) 22 to be applied to the gate 18 of the pass transistor 14. When the power source (Vpwr) 22 is off, the gate voltage 46 is the input voltage (Vin) less two diode drops (2 Vtn) or Vin-2 Vtn, making sure that the gate oxide of pass transistor in not stressed. At the same time the gate voltage (Pgate) 46 of PMOS 32 is also raised to Vin-2 Vtn, thus switching off the PMOS 32, and avoiding a direct current path from input signal 12 to second voltage source (Vpwr) 22.

An electronic static discharge (ESD) protection circuit 61 may be provided between the input signal 12 and the pass transistor 14. The circuit 61 has two identical legs that have a source 62 of a transistor 63 connected to the input signal 12. The gate 64 of the transistor 63 is connected to a diode 65. The diode 65 is then connected to ground. A resistor 66 separates the two legs of the ESD circuit. The diode 65 and transistor 63 are low voltage devices. As a result the gate oxide of the transistor 63 is subject to the same concerns as the pass transistor 14. The gate oxide stress of transistor 63 is eliminated by applying the same gate voltage 18 to the transistor 63 as is applied to the pass transistor.

Figure 2:
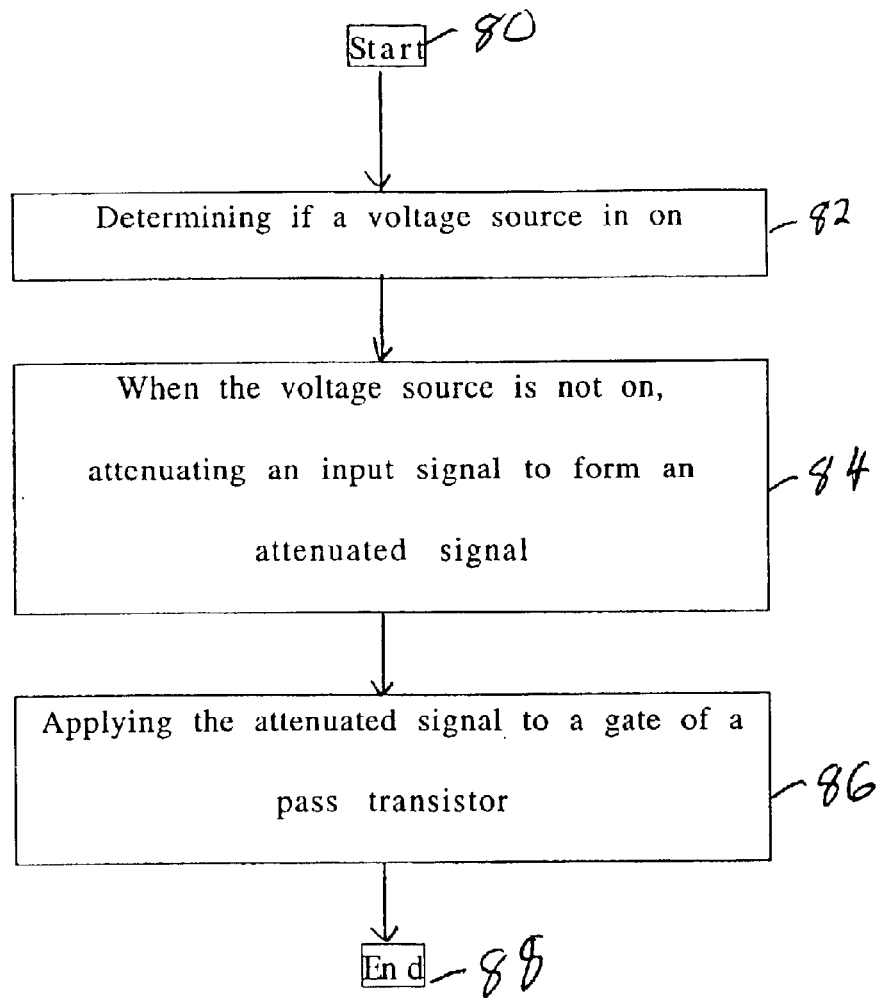
FIG. 2 is a flow chart of the steps used in a method of operating an input gate protection circuit in accordance with one embodiment of the invention.

FIG. 2 is a flow chart of the steps used in a method of operating an input gate protection circuit in accordance with one embodiment of the invention. The process starts, step 80, by determining if a voltage source is on at step 82. When the voltage source is not on, an input signal is attenuated to form an attenuated signal at step 84. At step 86 the attenuated signal is applied to the gate of the pass transistor which ends the process at step 88. When the voltage source is on, the voltage source is applied to the gate of. the pass transistor. In one embodiment, the signal is attenuated by a diode. In another embodiment a plurality of diodes are used to attenuate the signal. A resistor may be used to attenuate the signal, however this may draw too much current for some applications.

In one embodiment, when the voltage source is on it is applied through a controllable switch. The controllable switch may be a transistor.

Thus there has been described an input gate protection circuit and method that protects the gate oxide of the pass transistor and converts the high voltage signal to a second voltage range.

While the invention has been described in conjunction with specific embodiments thereof, it is evident that many alterations, modifications, and variations will be apparent to those skilled in the art in light of the foregoing description. For instance, standard diodes may be used instead of diode coupled transistors. In addition, the number of diodes may be varied. Accordingly, it is intended to embrace all such alterations, modifications, and variations in the appended claims.

What is claimed is:

1. An input gate protection circuit comprising:
   a pass transistor having a source coupled to an input signal;
   a first voltage range control circuit coupled to a gate of the pass transistor, wherein the input signal is isolated from ground when a low voltage source is off; and
   a second voltage range control circuit coupled to the gate of the pass transistor.

2. The circuit of claim 1, further including an input shaping device having an input coupled to a drain of the pass transistor.

3. The circuit of claim 1, wherein the first voltage range control circuit includes a diode coupled between the input signal and the gate of the pass transistor.

4. The circuit of claim 1, wherein the first voltage range control circuit includes a pair of diodes coupled between the input signal and the gate of the pass transistor.

5. The circuit of claim 1, wherein the input signal has a first voltage range.

6. The circuit of claim 1, wherein the second voltage range circuit includes a transistor coupling the gate of the pass transistor to a second voltage source.

7. The circuit of claim 6, wherein the transistor has a gate coupled to the input signal.

8. An input gate protection circuit comprising:
   a pass transistor having a source coupled to an input signal;
   a first control circuit coupled to a gate of the pass transistor, wherein the input signal is isolated from a ground when a low voltage source is off; and
   a second control circuit coupled the gate of the pass transistor.

9. The circuit of claim 8, wherein the first control circuit has an input coupled to the input signal.

10. The circuit of claim 8, wherein the second control circuit has an input coupled to a second voltage source.

11. The circuit of claim 8, wherein the first control circuit includes a plurality of diodes.

12. The circuit of claim 8, wherein the second control circuit includes a transistor having a source coupled to a second voltage source.

13. The circuit of claim 12, wherein the transistor has a drain coupled to the gate of the pass transistor.

14. The circuit of claim 12, wherein the transistor has a gate coupled to the input signal and to the second voltage source.

15. The circuit of claim 8, further including an electronic static discharge circuit having a transistor with a gate coupled to the gate of the pass transistor.

16. A method of operating an input gate protection circuit comprising:
   a) determining if a second voltage source is on;

b) when the second voltage source is not on, attenuating an input signal to form an attenuated signal and isolating the input signal from ground; and c) applying the attenuated signal to a gate of a pass transistor.

17. The method of claim 16, further including the steps of:

d) when the second voltage source is on, applying the second voltage source to the gate of the pass transistor.

18. The method of claim 16, wherein step (b) further includes the steps of:

b1) coupling a diode between the input signal and the gate of the pass transistor.

19. The method of claim 16, wherein a peak input voltage of the input signal is greater than a voltage of the second voltage source.

20. The method of claim 17, wherein step (d) further includes the step of:

d1) applying the second voltage source through a controllable switch.

* * * * *